(12) United States Patent
Nakamura et al.

(10) Patent No.: US 11,841,393 B2
(45) Date of Patent: Dec. 12, 2023

(54) COOLING UNIT, OBJECTIVE LENS MODULE, SEMICONDUCTOR INSPECTION DEVICE, AND SEMICONDUCTOR INSPECTION METHOD

(71) Applicant: HAMAMATSU PHOTONICS K.K., Hamamatsu (JP)

(72) Inventors: Tomonori Nakamura, Hamamatsu (JP); Hirotaka Nonaka, Hamamatsu (JP); Hiroyuki Matsuura, Hamamatsu (JP); Hirotoshi Terada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 300 days.

(21) Appl. No.: 17/417,190

(22) PCT Filed: Oct. 9, 2019

(86) PCT No.: PCT/JP2019/039879
§ 371 (c)(1),
(2) Date: Jun. 22, 2021

(87) PCT Pub. No.: WO2020/137083
PCT Pub. Date: Jul. 2, 2020

(65) Prior Publication Data
US 2022/0091182 A1 Mar. 24, 2022

(30) Foreign Application Priority Data
Dec. 27, 2018 (JP) .................. 2018-244316

(51) Int. Cl.
G01R 31/28 (2006.01)
G01R 31/26 (2020.01)
H01L 23/473 (2006.01)

(52) U.S. Cl.
CPC ......... *G01R 31/2877* (2013.01); *G01R 31/26* (2013.01); *G01R 31/2868* (2013.01); *H01L 23/473* (2013.01)

(58) Field of Classification Search
CPC ........... G01R 31/2874; G01R 31/2875; G01R 31/2877
See application file for complete search history.

(56) References Cited

U.S. PATENT DOCUMENTS

| 6,140,141 A | 10/2000 | Davidson |
| 2003/0098692 A1 | 5/2003 | Cotton et al. |

(Continued)

FOREIGN PATENT DOCUMENTS

| CN | 103477432 A | 12/2013 |
| JP | 2005-045144 A | 2/2005 |

(Continued)

OTHER PUBLICATIONS

International Preliminary Report on Patentability dated Jul. 8, 2021 for PCT/JP2019/039879.

*Primary Examiner* — Tung X Nguyen
(74) *Attorney, Agent, or Firm* — Faegre Drinker Biddle & Reath LLP

(57) ABSTRACT

Provided is a cooling unit to be used in an inspection of a semiconductor device. The cooling unit includes a jacket for dissipating heat of the semiconductor device. The jacket is provided with a light passing portion for passing light from the semiconductor device. The jacket has a space defining surface that faces the semiconductor device and defines a space between the space defining surface and the semiconductor device in a state where the light passing portion faces the semiconductor device. The jacket is provided with a supply flow path through which a fluid to be supplied to the space flows.

25 Claims, 11 Drawing Sheets

(56) References Cited

U.S. PATENT DOCUMENTS

| | | |
|---|---|---|
| 2004/0032275 A1 | 2/2004 | Cader et al. |
| 2009/0095097 A1 | 4/2009 | Wadell |
| 2010/0039117 A1 | 2/2010 | Jacobs |
| 2010/0110540 A1 | 5/2010 | Niv et al. |
| 2014/0054762 A1* | 2/2014 | Nagaune ............... H01L 23/473 257/714 |
| 2018/0100891 A1* | 4/2018 | Stellari ................ G01R 31/311 |

FOREIGN PATENT DOCUMENTS

| | | |
|---|---|---|
| JP | 2006-019676 A | 1/2006 |
| JP | 2006-519359 A | 8/2006 |
| JP | 2008-141207 A | 6/2008 |
| JP | 2010-122181 A | 6/2010 |
| JP | 2012-168191 A | 9/2012 |
| JP | 2016-021452 A | 2/2016 |
| JP | 2016-075549 A | 5/2016 |
| TW | 200300572 A | 6/2003 |
| WO | WO-2004/079380 A1 | 9/2004 |
| WO | WO-2016/063676 A1 | 4/2016 |

\* cited by examiner

COOLING UNIT, OBJECTIVE LENS MODULE, SEMICONDUCTOR INSPECTION DEVICE, AND SEMICONDUCTOR INSPECTION METHOD

TECHNICAL FIELD

An aspect of the present disclosure relates to a cooling unit, an objective lens module, a semiconductor inspection device, and a semiconductor inspection method.

BACKGROUND ART

As a cooling unit used in an inspection of a semiconductor device, for example, a cooling unit described in Patent Literature 1 is known. The cooling unit described in Patent Literature 1 is used for observing a semiconductor device being driven while cooling the semiconductor device. In the cooling unit described in Patent Literature 1, the semiconductor device is cooled by ejecting the cooling liquid to the semiconductor device.

CITATION LIST

Patent Literature

Patent Literature 1: U.S. Patent Publication No. 2 009/0095097

SUMMARY OF INVENTION

Technical Problem

For example, when a semiconductor device having large power consumption is inspected, the cooling unit as described above is required to have high cooling performance. Therefore, it is an object of an aspect of the present disclosure to provide a cooling unit and an objective lens module with improved cooling performance, a semiconductor inspection device including such a cooling unit, and a semiconductor inspection method capable of inspecting a semiconductor device while suitably cooling the semiconductor device.

Solution to Problem

A cooling unit according to an aspect of the present disclosure is a cooling unit to be used in an inspection of a semiconductor device, the cooling unit including: a jacket for dissipating heat of the semiconductor device, in which the jacket is provided with a light passing portion through which light from the semiconductor device passes, the jacket has a space defining surface that faces the semiconductor device and defines a space between the space defining surface and the semiconductor device in a state where the light passing portion faces the semiconductor device, and the jacket is provided with a supply flow path through which a fluid to be supplied to the space flows.

When the cooling unit is used for inspection of semiconductor devices, for example, the cooling unit is disposed such that the light passing portion faces the semiconductor device and a space is defined between the space defining surface and the semiconductor device. Then, while flowing the fluid to the space via the supply flow path, the light emitted from the semiconductor device being driven and passing through the light passing portion is detected. Flowing a fluid to the space defined between the jacket and the semiconductor device can effectively cool the semiconductor device. This is because the heat of the semiconductor device is removed by the fluid and the heat of the semiconductor device is efficiently transferred to the jacket via the fluid. Therefore, according to this cooling unit, high cooling performance can be realized.

The jacket may be further provided with a discharge flow path through which the fluid discharged from the space flows. In this case, the fluid can be caused to flow through the space via the supply flow path and the discharge flow path, and the semiconductor device can be cooled more effectively.

The jacket may be further provided with a coolant flow path through which a coolant for cooling the jacket flows. In this case, the jacket can be more suitably cooled.

The space defining surface may extend so as to surround the light passing portion. In this case, the semiconductor device can be cooled more effectively.

The space defining surface may extend in a plane shape. In this case, the semiconductor device can be cooled more effectively.

The space defining surface may be continuous with the light passing portion. In this case, the semiconductor device can be cooled more effectively.

The space defining surface may be a bottom surface of a recessed portion formed in the jacket. In this case, the space can be more suitably defined between the jacket and the semiconductor device.

The thickness of the space may be more than 0 mm and not more than 0.05 mm. In this case, the semiconductor device can be cooled more effectively.

Alternatively, the thickness of the space may be not less than 0.05 mm and not more than 0.5 mm. In this case, the semiconductor device can be cooled more effectively.

The cooling unit according to an aspect of the present disclosure may further include an elastic member that is sandwiched between the jacket and a stage on which the semiconductor device is disposed to seal the space. In this case, the space between the jacket and the semiconductor device can be more reliably sealed.

The jacket may be provided with at least two of the supply flow paths. In this case, the semiconductor device can be cooled more effectively.

When viewed from a direction perpendicular to the space defining surface, a position at which the fluid is supplied from the supply flow path to the space may be located inside a position at which the fluid is discharged from the space to the discharge flow path. In this case, the semiconductor device can be cooled more effectively.

The supply flow path may be configured to discharge the fluid toward the light passing portion. In this case, the semiconductor device can be cooled more effectively.

At least one of a recessed portion and a protruding portion may be formed on the space defining surface. In this case, the fluid flowing through the space can be made turbulent, and the heat of the semiconductor device can be more efficiently transferred to the jacket.

The light passing portion may be configured by disposing a light transmitting member in an opening provided to the jacket. In this case as well, high cooling performance can be realized.

The light transmitting member may close the opening in a watertight manner. In this case, the fluid can be prevented from leaking from the opening.

An objective lens module according to an aspect of the present disclosure includes the cooling unit described above, an objective lens facing the light passing portion, and a solid immersion lens held so as to be positioned on an optical axis of the objective lens. The light passing portion is configured by an opening provided to the jacket, and the solid immersion lens is disposed in the opening. According to this objective lens module, high cooling performance can be realized for the reasons described above.

The objective lens module according to an aspect of the present disclosure may further include a biasing member that biases the cooling unit toward a side opposite to the objective lens. In this case, for example, the cooling unit can be more suitably brought into close contact with the stage on which the semiconductor device is disposed.

The objective lens module according to an aspect of the present disclosure may further include a holder that is attached to the objective lens and holds the solid immersion lens, and the holder may have a flexible member that contacts a peripheral portion of the solid immersion lens and holds the solid immersion lens in a watertight and swingable manner. In this case, since the solid immersion lens is swingable, the solid immersion lens can be easily brought into close contact with the semiconductor device. Further, since the solid immersion lens is held watertight, it is possible to prevent fluid from leaking from the periphery of the solid immersion lens.

The objective lens module according to an aspect of the present disclosure may further include: a holder attached to the objective lens and holding the solid immersion lens; and a sealing member sandwiched between the holder and the jacket to seal between the holder and the jacket. In this case, the fluid can be prevented from leaking from between the holder and the jacket.

A semiconductor inspection device according to an aspect of the present disclosure includes the cooling unit described above, a stage on which the semiconductor device is disposed, an objective lens facing the semiconductor device via a light passing portion, and a photodetector that detects light from the semiconductor device via the light passing portion and the objective lens. According to this semiconductor inspection device, a high cooling performance can be realized for the reasons described above.

The semiconductor inspection device according to an aspect of the present disclosure may further include a pressure adjuster that changes the pressure of the fluid flowing through the space, and a controller that controls the pressure adjuster. In this case, the semiconductor device can be cooled more effectively.

The controller may control the pressure adjuster such that the pressure of the fluid flowing through the space is lower than the pressure outside the cooling unit. In this case, since the pressure in the space becomes negative, the cooling unit can be more suitably brought into close contact with the stage. In addition, it is possible to suppress leakage of the fluid from the gap or the like.

The semiconductor inspection device according to an aspect of the present disclosure may further include a biasing device that biases the cooling unit toward the stage. In this case, the cooling unit can be more suitably brought into close contact with the stage.

According to an aspect of the present disclosure, there is provided a semiconductor inspection method including: disposing a semiconductor device on a stage; disposing a cooling unit having a jacket provided with a light passing portion for passing light from the semiconductor device such that the light passing portion faces the semiconductor device and a space is defined between the jacket and the semiconductor device; driving the semiconductor device; and detecting light coining from the semiconductor device being driven and passing through the light passing portion by a photodetector while flowing a fluid in the space.

In this semiconductor inspection method, while flowing a fluid through a space defined between the jacket and the semiconductor device, light coining from the semiconductor device being driven and passing through the light passing portions is detected. Flowing a fluid through a space defined between the jacket and the semiconductor device can effectively cool the semiconductor device. This is because the heat of the semiconductor device is removed by the fluid and the heat of the semiconductor device is efficiently transferred to the jacket via the fluid. Therefore, according to the semiconductor inspection method, the semiconductor device can be inspected while being cooled suitably.

Advantageous Effects of Invention

According to an aspect of the present disclosure, it is possible to provide a cooling unit and an objective lens module with improved cooling performance, a semiconductor inspection device including such a cooling unit, and a semiconductor inspection method capable of inspecting a semiconductor device while suitably cooling the semiconductor device.

DESCRIPTION OF EMBODIMENTS

Figure 1:
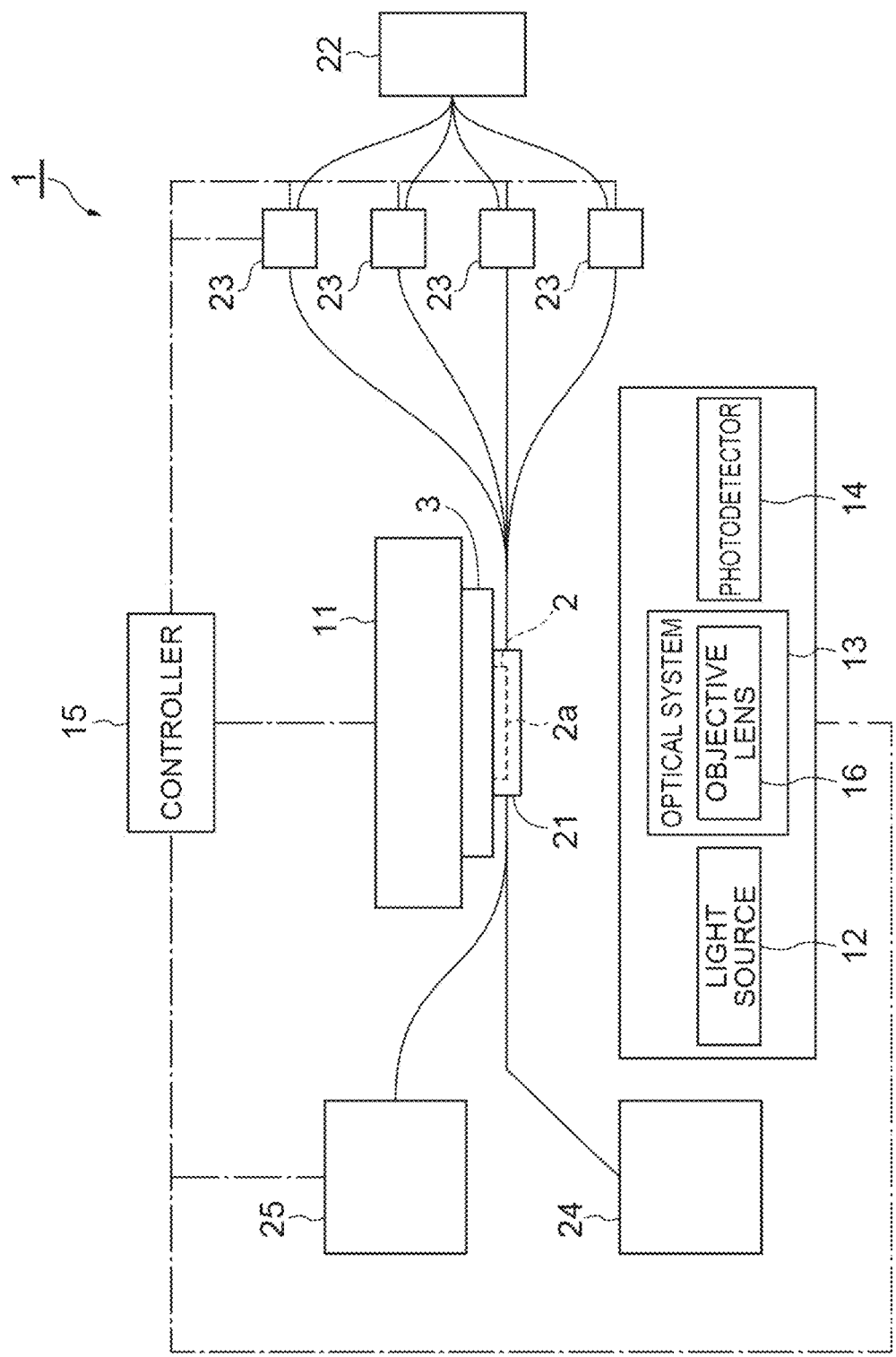
FIG. 1 is a configuration diagram of a semiconductor inspection device according to an embodiment.

Hereinafter, an embodiment of the present disclosure will be described in detail with reference to the drawings. In the following description, the same reference numerals are used for the same or corresponding element, and redundant description is omitted.

[Configuration of Semiconductor Inspection Device]

A semiconductor inspection device 1 shown in FIG. 1 is an apparatus for observing and inspecting a semiconductor device 2 which is a device of an inspection target (DUT: Device Under Test). The semiconductor inspection device 1 is used, for example, to identify a failure location in the semiconductor device 2.

The semiconductor device 2 is, for example, a device including a logic large scale integration (LSI). The logic LSI includes a transistor having a metal-oxide-semiconductor (MOS) structure, a transistor having a bipolar structure, and the like. The power consumption of the semiconductor device 2 is, for example, about 200 W. The semiconductor device 2 is disposed (fixed) on the stage 3.

The semiconductor inspection device 1 includes a signal input device 11, a light source 12, an optical system 13, a photodetector 14, and a controller 15. The signal input device 11 is electrically connected to the semiconductor device 2, and inputs a signal to the semiconductor device 2 to drive the semiconductor device 2. The signal input device 11 is, for example, a pulse generator that applies a stimulus signal to the semiconductor device 2, a tester unit that inputs a test signal to the semiconductor device 2, or the like. The signal input device 11 repeatedly inputs a signal such as a predetermined test pattern to the semiconductor device 2. The signal input by the signal input device 11 may be a modulated voltage signal or a DC voltage signal.

The light source 12 outputs light for illuminating the semiconductor device 2. The light source 12 is, for example, a light emitting diode (LED), a laser diode (LD), a super luminescent diode (SLD), or a lamp light source. The wavelength of the light output from the light source 12 may be, for example, 1064 nm or more. The light output from the light source 12 is guided to the optical system 13.

The optical system 13 guides light output from the light source 12 to the surface 2a of the semiconductor device 2, and guides light from the surface 2a of the semiconductor device 2 to the photodetector 14. The optical system 13 includes, for example, an objective lens 16, an optical scanner (not shown), and a beam splitter (not shown). The objective lens 16 condenses the light output from the light source 12 and guided by the beam splitter and the optical scanner on the observation area or scans the light on the observation area. The optical system 13 is mounted on, for example, an X-Y-Z stage (not shown). The X-Y-Z stage is configured to be movable in the Z-axis direction and in the X-axis direction and the Y-axis direction both orthogonal to the Z-axis direction, where the Z-axis direction is parallel to the optical axes of the objective lenses 16. The observation area is determined by the position of the X-Y-Z stage.

The light output from the light source 12 and emitted from the optical system 13 is reflected by the semiconductor device 2 being driven, and enters the photodetector 14 via the optical system 13. At this time, the intensity of light reflected by the semiconductor device 2 is modulated in accordance with the driving state of the semiconductor device 2.

The photodetector 14 detects the light modulated by the semiconductor device 2 and outputs waveform data. The photodetector 14 may detect light incident thereon while the light is scanned on the semiconductor device 2 by the optical scanner and output a measurement image. Based on the waveform data or the measurement image, it is possible to specify a failure location in the semiconductor device 2.

The photodetector 14 may detect light incident on the semiconductor device 2 while the light is being scanned and output a pattern image. The pattern image is an image captured so that a circuit pattern or the like of the semiconductor device 2 can be checked. As the photodetector 14, for example, a photodiode, an avalanche diode (APD), a Silicon Photomultiplier (SiPM), or the like which are capable of detecting light having a wavelength transmitted through the substrate of the semiconductor device 2 can be used.

The controller 15 is electrically connected to the signal input device 11, the light source 12, the optical system 13, the photodetector 14, and the like, and performs control of the entire semiconductor inspection device 1. The controller 15 is configured by, for example, a computer including a processor (CPU: Central Processing Unit), and a RAM (Random Access Memory), a ROM (Read Only Memory), an HDD (Hard Disk Drive), and the like which are storage media. The controller 15 executes processing by the processor on data stored in the storage medium. For example, the controller 15 performs a process of specifying a failure location in the semiconductor device 2 based on the detection result of the photodetector 14.

[Configuration for Cooling Semiconductor Device]

The semiconductor inspection device 1 further includes a cooling unit 21, a storage tank 22, four regulators (pressure adjusters) 23, a drain tank 24, and a chiller 25. The cooling unit 21, storage tank 22, regulator 23, drain tank 24, and chiller 25 are used to cool the semiconductor device 2 during the inspection of the semiconductor device 2. The cooling unit 21 is combined with the objective lens 16 to form an objective lens module 60.

[Cooling Unit]

The cooling unit 21 will be described with reference to FIGS. 2 to 8. The cooling unit 21 is disposed so as to face the semiconductor device 2, and defines a space (gap) S1 between the cooling unit 21 and the semiconductor device 2. In the semiconductor inspection device 1, the semiconductor device 2 is cooled by flowing the fluid 5 through the space S1. The fluid 5 is, for example, water or pure water, but may be a Fluorinert (registered trademark)-based liquid having electrical insulation properties.

Figure 7:
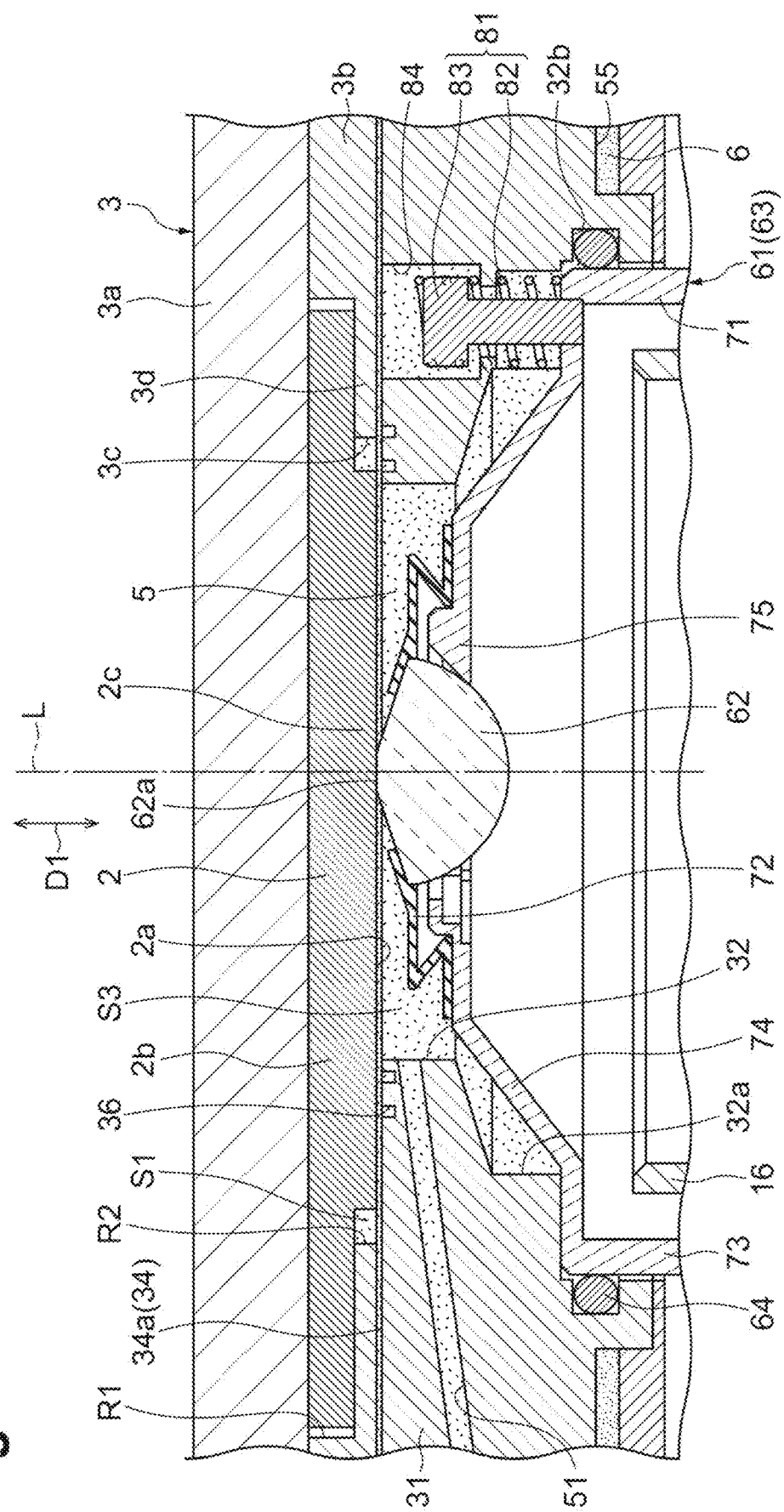
FIG. 7 is a cross-sectional view showing a state in which a solid immersion lens is in contact with a semiconductor device.
Figure 8:
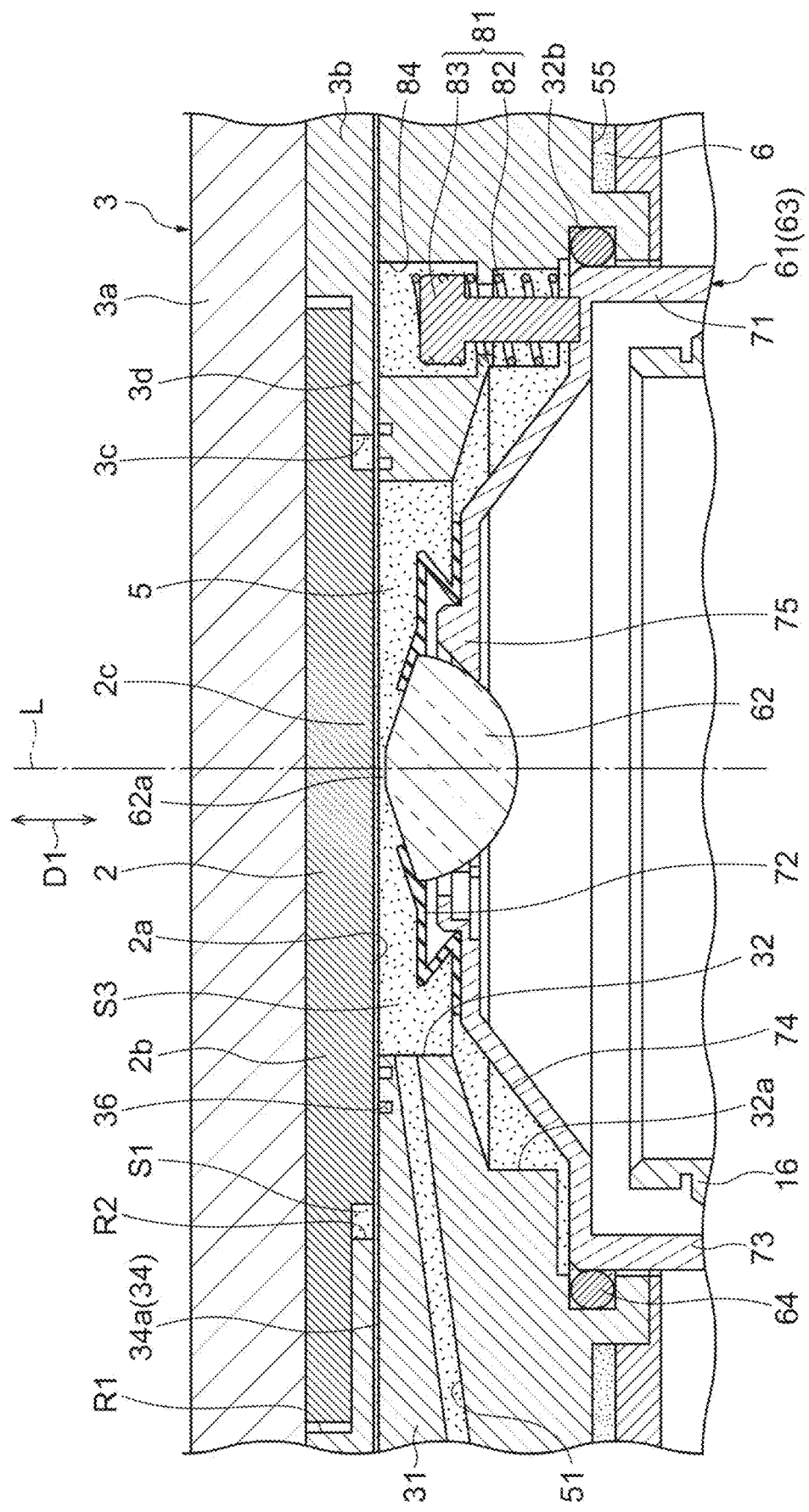
FIG. 8 is a cross-sectional view showing a state in which a solid immersion lens is separated from a semiconductor device.

The cooling unit 21 is attached to the stage 3 in which the semiconductor device 2 are arranged. In this example, the stage 3 includes a DUT board 3a and a holding part 3b. The DUT board 3a is formed in a plate shape, for example, and forms a connector between the signal input apparatus 11 and the semiconductor device 2. The DUT board 3a may incorporate a socket that forms a connector between the signal input apparatus 11 and the semiconductor device 2. As shown in FIGS. 7 and 8, the semiconductor device 2 includes a package 2b and a die 2c protruding from the package 2b. For example, the package 2b is a PC board, and the die 2c is a semiconductor portion mounted (bonded) on the package 2b.

The holding part 3b is fixed to the DUT board 3a and holds the semiconductor device 2. The holding part 3b is formed of a metal in a plate shape, for example. In this example, the holding part 3b is provided with an opening 3c. The opening 3c has a first portion R1 in which the package 2b is disposed and a second portion R2 in which the die 2c is disposed, and is opened in each of the first portion R1 and the second portion R2. The holding part 3b has a locking portion 3d that comes into contact with the peripheral portion of the package 2b disposed in the first portion R1. In this example, the locking portion 3d is formed by the inner surface of the opening 3c that defines the second portion R2 being located inside the inner surface that defines the first portion R1. In this example, the thickness of the locking portion 3d is equal to the thickness of the die 2c, but the thickness of the locking portion 3d may be thicker or thinner than the thickness of the die 2c.

The cooling unit 21 includes a jacket 31 for dissipating heat of the semiconductor device 2. The jacket 31 is formed of, for example, metal in a substantially disk-like block shape. The jacket 31 is disposed so as to face the semiconductor device 2 and the holding part 3b.

The jacket 31 has a first surface 31a and a second surface 31b opposite to the first surface 31a. The first surfaces 31a face the semiconductor device 2 and the holding parts 3b when the cooling unit 21 is attached to the stage 3. The jacket 31 is provided with an opening 32 passing through the jacket 31 along a direction D1 perpendicular to the first surface 31a. The opening 32 has, for example, a substantially truncated cone shape expanding toward the second surface 31b side. The opening 32 functions as a light passing portion through which light from the semiconductor device 2 passes.

A recessed portion 33 is formed in the first surface 31a. In this example, the recessed portion 33 is formed by a portion of the first surface 31a other than the peripheral portion 31a1 being lower than the peripheral portion 31a1. The recessed portion 33 has a first portion 34 and a second portion 35. The first portion 34 is an annular portion surrounding the opening 32 when viewed from the direction D1. The second portion 35 is an annular portion located outside the first portion 34 and connected to the first portion 34 when viewed from the direction D1. The depth of the second portion 35 is greater than the depth of the first portion 34. The bottom surface 34a of the first portion 34 is continuous with the opening 32 and surrounds the opening 32 when viewed from the direction D1. The bottom surface 34a extends in a planar shape and has an annular shape when viewed from the direction D1.

Figure 3:
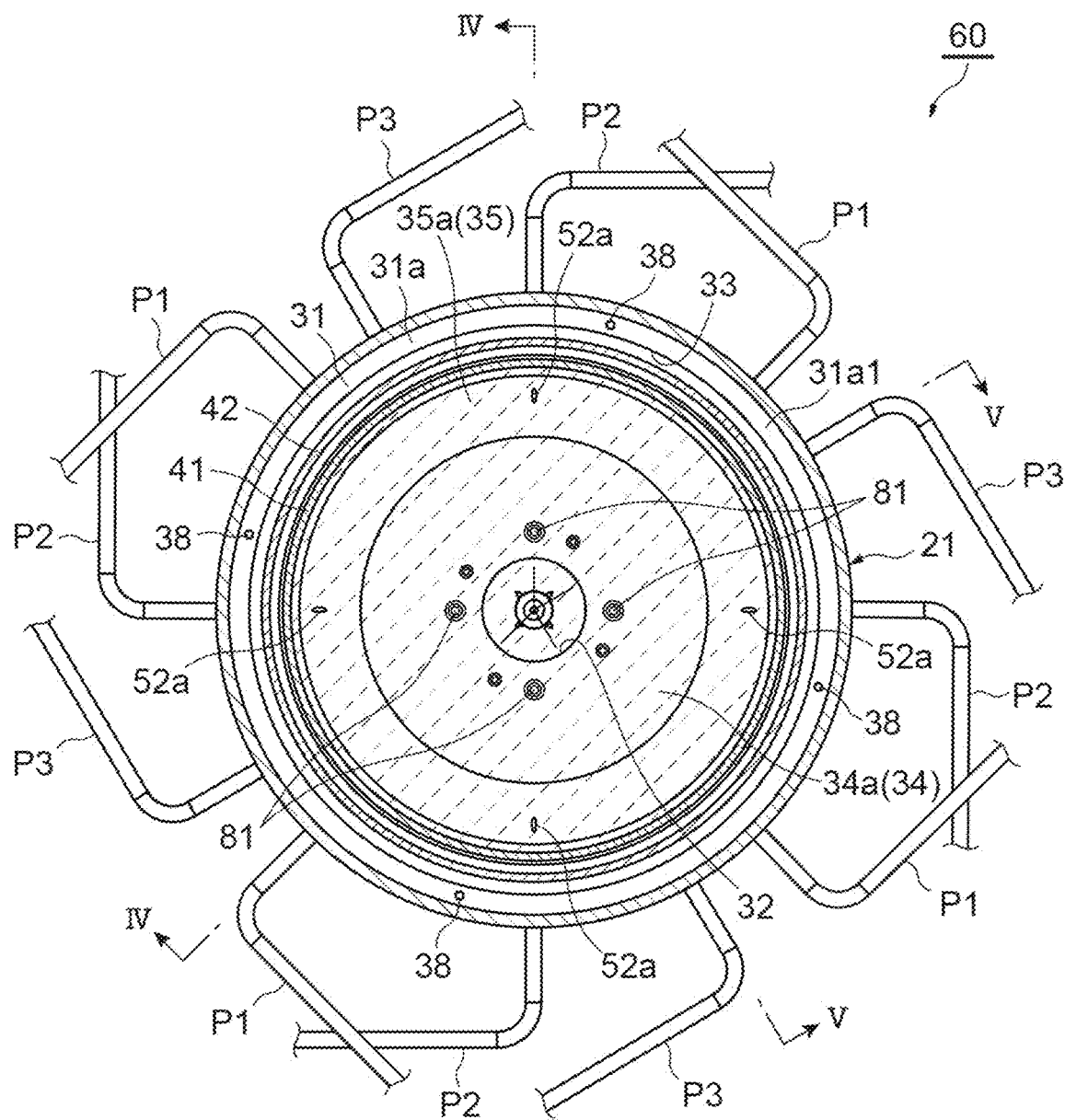
FIG. 3 is a plan view of an objective lens module.

A groove portion (recessed portion) 36 extending in a swirling shape (spiral shape) is formed on a bottom surface 34a of the first portion 34 (FIGS. 7 and 8). A pair of arrangement grooves 37 in which the elastic members 41, 42 are respectively arranged are formed in the bottom surface 35a of the second portion 35. The elastic members 41, 42 are sandwiched between the jacket 31 and the holding part 3b to seal the space S1. As shown in FIG. 3, the elastic members 41, 42 are formed in a ring shape, for example. In FIG. 3, the elastic members 41, 42 are indicated by hatching for easy understanding. As shown in FIG. 3, the four magnets 38 are arranged on the peripheral portion 31a1 of the first surface 31a at regular intervals in the circumferential direction. By utilizing the attractive force of the magnet 38, the jacket 31 can be detachably attached to the holding part 3b.

The jacket 31 is provided with four supply flow paths 51 through which the fluid 5 supplied to the space S1 flows and 4 discharge flow paths 52 through which the fluid 5 discharged from the space S1 flows. Each of the supply flow paths 51 extends linearly and is open to the outer side surface 31c of the jacket 31 and the inner surface 32a of the opening 32. The four supply flow paths 51 are arranged at regular intervals in the circumferential direction. Each opening in the outer side surface 31c is provided with a valve 53 which is openable and closable. As shown in FIG. 3, each valve 53 is connected to a pipe P1 through which the fluid 5 supplied from the storage tank 22 flows. In the supply flow path 51, the fluid 5 flows from the outer side surface 31c toward the inner surface 32a, and the fluid 5 is discharged into the opening 32. That is, the supply flow path 51 is configured to discharge the fluid 5 toward the opening 32.

Each of the discharge flow paths 52 extends linearly and is open to the outer side surface 31c of the jacket 31 and the bottom surface 35a of the second portion 35. The four discharge flow paths 52 are arranged at regular intervals in the circumferential direction. Each opening in the outer side surface 31c is provided with a valve 54 which is openable and closable. As shown in FIG. 3, each valve 54 is connected to a pipe P2 through which the fluid 5 discharged to the drain tank 24 flows. In the discharge flow path 52, the fluid 5 flows from the bottom surface 35a toward the outer side surface 31c, and the fluid 5 is discharged to the outside of the jacket 31. FIG. 3 shows a discharge port 52a through which the fluid 5 is discharged from the discharge flow path 52 to the bottom surface 35a.

Figure 4:
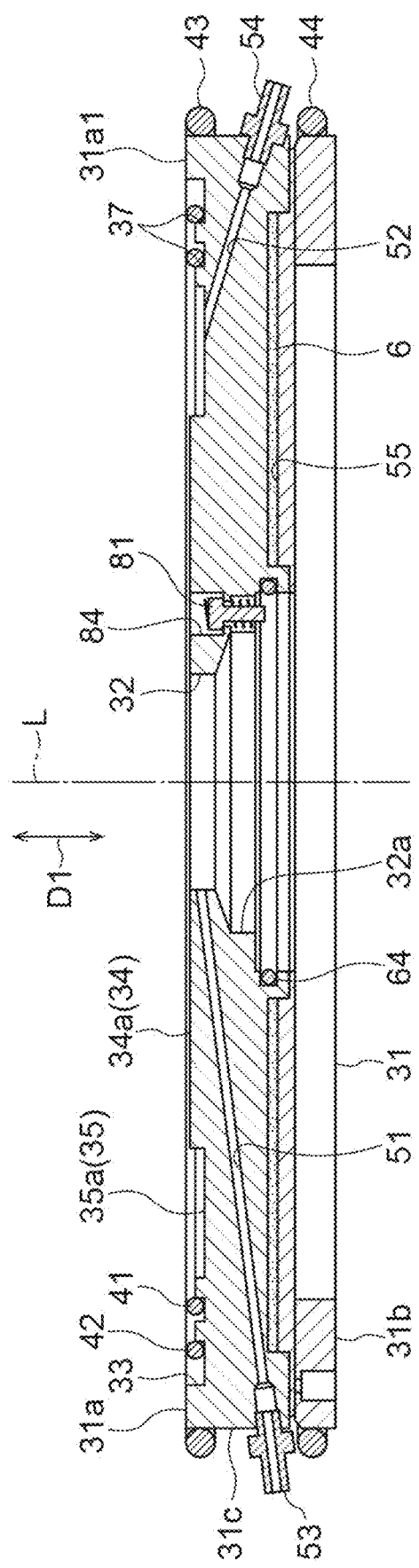
FIG. 4 is a cross-sectional view of the cooling unit taken along line IV-IV of FIG. 3.
Figure 5:
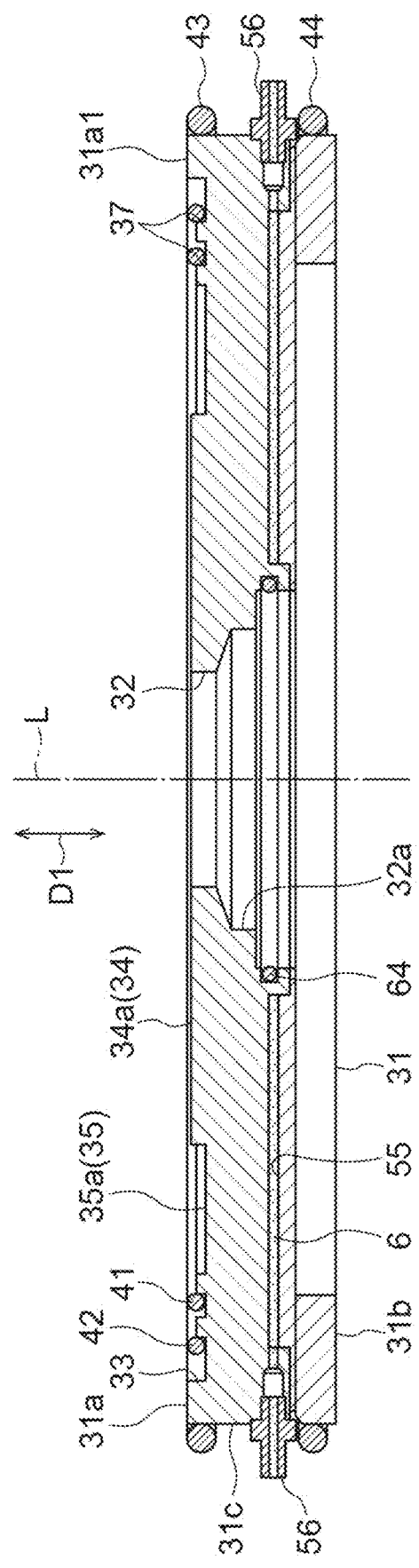
FIG. 5 is a cross-sectional view of the cooling unit taken along line V-V of FIG. 3.

Further, the jacket 31 is provided with a coolant flow path 55 through which a coolant 6 for cooling the jacket 31 flows. The coolant 6 is, for example, water. For example, the coolant flow path 55 extends in a planar shape perpendicular to the direction D1, and has an annular shape surrounding the opening 32 when viewed from the direction D1. The coolant flow path 55 is open to the outside at the outer side surface 31c of the jacket 31. In this example, the coolant flow path 55 is opened at four positions at a constant interval in the circumferential direction. As shown in FIG. 5, each opening is provided with a valve 56 which is openable and closable. As shown in FIG. 3, each valve 56 is connected to a pipe P3 through which the coolant 6 flows. In the coolant flow path 55, the coolant 6 flows from one or a plurality of openings toward another opening, and the coolant 6 flows in the coolant flow path 55. Thus, the jacket 31 is cooled. In FIGS. 4 and 5, a region in which the coolant 6 flows is indicated by hatching.

Referring again to FIG. 1, the paths through which the fluid 5 and the coolant 6 flow will be described. The fluid 5 is stored in the storage tank 22. The fluid 5 in the storage tank 22 is pressurized by a compressor (not shown) and supplied to the supply flow paths 51 via the regulator 23. Each of the four regulators 23 is connected to the supply flow path 51 via the pipe P1. Each regulator 23 is controlled by the controller 15 to change the pressure of the fluid flowing through the supply flow path 51. Accordingly, the pressure of the fluid 5 flowing through the space S1 is adjusted. The fluid 5 discharged from the discharge flow paths 52 is stored in the drain tank 24. The chiller 25 cools the coolant 6 and circulates the coolant 6 in the coolant flow path 55. The fluid 5 is cooled by the jacket 31 while flowing through the supply channel 51.

Figure 2:
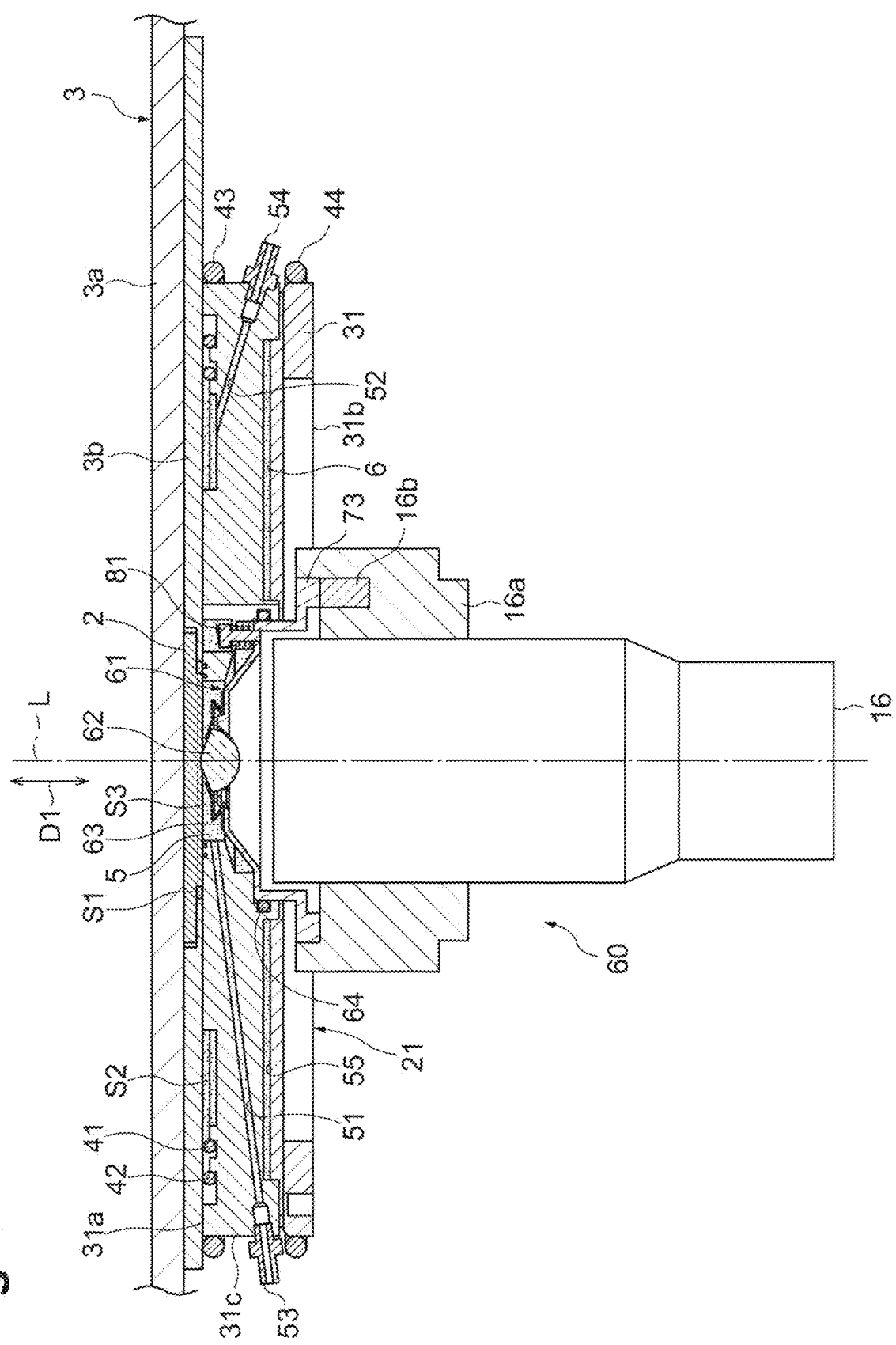
FIG. 2 is a sectional view around the objective lens module.

As shown in FIG. 2 and the like, two water leakage sensors 43, 44 are provided on the outer side surface 31c of the jacket 31. The water leakage sensor 43 is disposed so as to extend along a boundary between the outer side surface 31c and the first surface 31a. The water leakage sensor 43 detects whether or not the fluid 5 leaks from between the jacket 31 and the holding part 3b. The water leakage sensor 44 is disposed so as to extend along a boundary between the outer side surface 31c and the second surface 31b. The water leakage sensor 44 detects whether or not the fluid 5 or the coolant 6 leaks from the valves 53, 54, or 56 and whether or not the coolant 6 leaks from a gap or the like formed in the coolant flow path 55.

[Objective Lens Module]

As shown in FIGS. 2 to 8, the cooling unit 21 is combined with the objective lens 16 to form an objective lens module 60. The objective lens module 60 includes a solid immersion lens unit 61 attached to the objective lens 16 in addition to the cooling unit 21 and the objective lens 16 described above. The solid immersion lens unit 61 includes a solid immersion lens 62 and a holder 63. The objective lens 16 is disposed to face the semiconductor device 2 via the opening 32 of the jacket 31. The solid immersion lens 62 is held in the opening 32 by a holder 63 and is positioned on the optical axis L of the objective lens 16. In this example, the extending direction of the optical axis L is parallel to the direction D1.

In the following description, in a state in which the semiconductor device 2 disposed on the stage 3 and the objective lens 16 face each other, a side on which the objective lens 16 is positioned with respect to the semiconductor device 2 is referred to as a lower side, and a side on which the semiconductor device 2 is positioned with respect to the objective lens 16 is referred to as an upper side.

Figure 6:
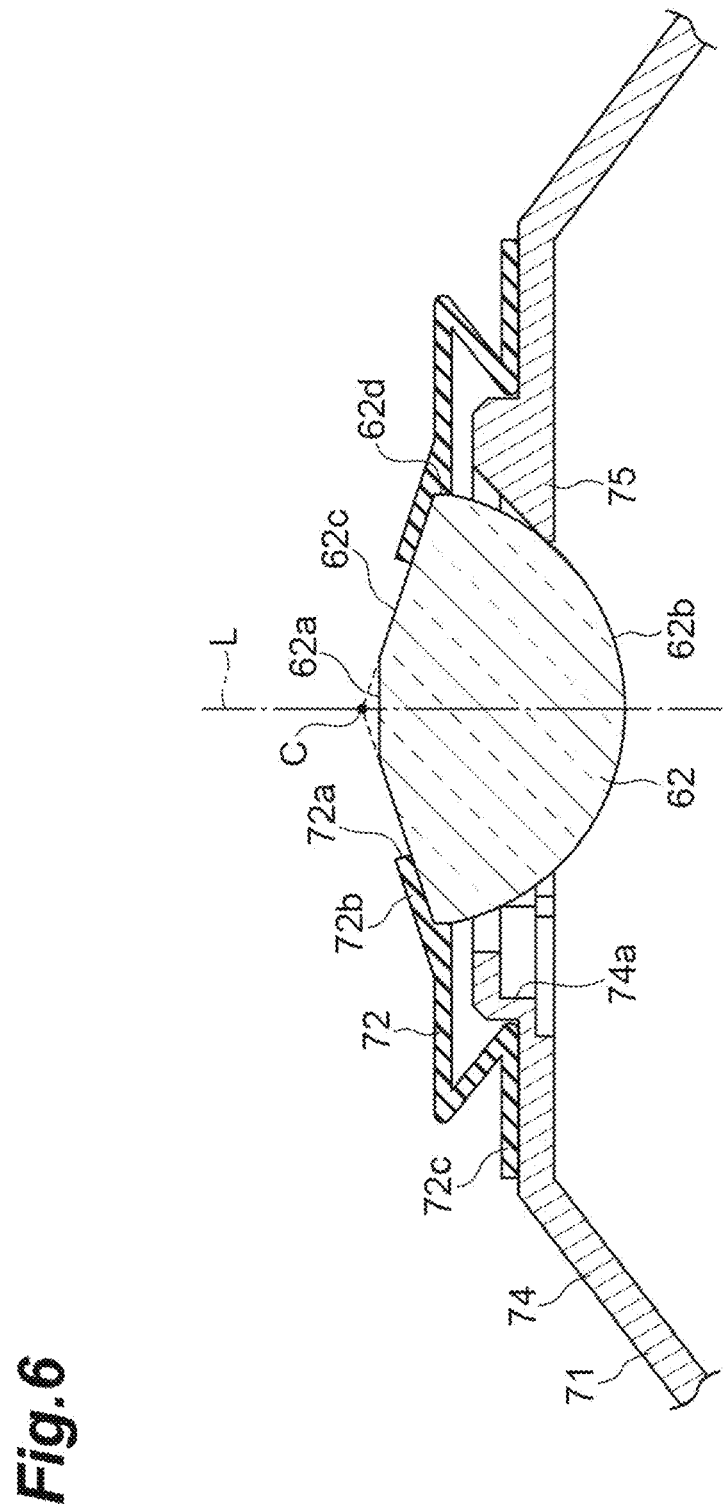
FIG. 6 is a cross-sectional view of a holder and a solid immersion lens.

As shown in FIG. 6, the solid immersion lens 62 has a abutting surface 62a, a spherical surface 62b, a tapered surface 62c, and a peripheral surface 62d. The abutting surface 62a is a flat surface and abuts against the die 2c of the semiconductor device 2. The spherical surface 62b is a hemispherical surface convex downward and faces the objective lens 16. The tapered surface 62c is a surface having a truncated cone shape expanding downward, and extends downward from the outer edge of the abutting surface 62a. The peripheral surface 62d is a cylindrical surface and is connected to the outer edge of the spherical surface 62b and the outer edge of the tapered surface 62c. The vertex of the virtual cone including the tapered surface 62c coincides with the spherical center C of the solid immersion lens 62 (the center of curvature of the spherical surface 62b), and is located on the optical axis L of the objective lens 16 above the abutting surface 62a. The spherical center C coincides with the focal point of the solid immersion lens 62.

The solid immersion lens 62 is formed of a high-refractive-index material having a refractive index substantially the same as or close to the substrate material of the semiconductor device 2. Typical examples thereof include Si, GaP and GaAs. The solid immersion lens 62 transmits observation light. By bringing the solid immersion lens 62 into close optical contact with the semiconductor device 2, the semiconductor device 2 itself can be used as a part of the solid immersion lens 62. In the backside analysis of the semiconductor device 2 using the solid immersion lens 62, when the focal point of the objective lens 16 is adjusted to the integrated circuits formed on the substrate of the semiconductor device 2, a light flux having a high numerical aperture (NA) can be passed through the semiconductor device 2 by the effect of the solid immersion lens 62, and high resolution can be achieved.

The solid immersion lens 62 is held in the opening 32 by a holder 63. The holder 63 includes an main body 71 and a flexible member 72. The main body 71 includes a side wall portion 73 and a lid portion 74. The main body 71 is formed of a nonmagnetic material (e.g., aluminum, an aluminum alloy, nonmagnetic stainless steel, or the like). The side wall portion 73 is formed in a cylindrical shape. The side wall portion 73 is connected to a mechanism portion 16a provided on a side surface of the objective lens 16. The lid portion 74 is formed integrally with the side wall portion 73 so as to close the upper opening of the side wall portion 73.

An opening 74a in which the solid immersion lens 62 is disposed is formed in the lid portion 74. The opening 74a is disposed on the optical axis L, and is opened upward and downward. The lid portion 74 includes a plurality of (e.g., three) protruding portions 75 extending from the inner surface of the opening 74a toward the center of the opening 74a. The protruding portion 75 has a tapered shape, and the surface on the semiconductor device 2 side is an inclined surface inclined so as to approach the objective lens 16 as approaching the center of the opening 74a. For example, the plurality of protruding portions 75 are arranged at regular intervals in the circumferential direction.

The flexible member 72 is formed of, for example, resin or the like, and has a shape in which a planar member is bent. The flexible member 72 is provided on the side opposite to the objective lens 16 with respect to the lid portion 74 so as to close the opening 74a of the lid portion 74. An opening 72a in which the solid immersion lens 62 is disposed is formed in the flexible member 72. The opening 72a is disposed on the optical axis L. The flexible member 72 has an annular sealing portion 72b coupled to the peripheral portion of the solid immersion lens 62 (in this example, the tapered surface 62c and the peripheral surface 62d) along the edge of the opening 72a. The sealing portion 72b watertightly seals between the solid immersion lens 62 and the flexible member 72. The flexible member 72 has a coupling portion 72c watertightly coupled to the lid portion 74 by, for example, welding or adhesion.

The solid immersion lens 62 is disposed in the opening 72a and the opening 74a such that the abutting surface 62a and the tapered surface 62c protrude upward from the opening 72a of the flexible member 72 and the spherical surface 62b protrudes downward from the opening 74a of the lid portion 74. The spherical surface 62b is in contact with the distal end portion of each protruding portion 75, and the abutting surface 62a and the tapered surface 62c are held by the flexible member 72. Accordingly, the solid immersion lens 62 is swingable in a state before the abutting surface 62a is brought into contact with the semiconductor device 2 (FIG. 8). For example, when the solid immersion lens 62 swings, the spherical surface 62b slides with respect to the distal end portion of the protruding portion 75, and the flexible member 72 deforms following the swing of the solid immersion lens 62. Since the solid immersion lens 62 is swingable, when the abutting surface 62a is brought into contact with the semiconductor device 2, the solid immersion lens 62 is easily brought into close contact with the semiconductor device 2. As a result, for example, even when the semiconductor device 2 is disposed so as to be inclined with respect to the optical axis L, the solid immersion lens 62 can be brought into close contact with the semiconductor device 2 suitably, and the semiconductor device 2 can be observed.

The objective lens module 60 further includes a sealing member 64 that seals between the holder 63 and the jacket 31. The sealing member 64 is formed in a ring shape and of an elastic material such as resin. The sealing member 64 is disposed in the recessed portion 32b provided in the inner surface 32a of the opening 32 of the jacket 31. The sealing member 64 is sandwiched between the side wall portion 73 and the bottom surface of the recessed portion 32b, and water-tightly seals between the holder 63 and the jacket 31.

The objective lens module 60 further includes four coupling portions 81 that couple the cooling unit 21 and the objective lens 16 to each other. Each of the coupling portions 81 is constituted by, for example, a bolt 83 with a spring (biasing member) 82. Each of the coupling portions 81 is disposed in a disposition hole 84 provided in the first portion 34 of the recessed portion 33 in the jacket 31. The disposition hole 84 communicates the first portion 34 with the opening 32. The four coupling portions 81 are arranged along the circumferential direction at regular intervals in the circumferential direction. In each coupling portion 81, the head of the bolt 83 is disposed in the disposition hole 84, and the screw portion of the bolt 83 is screwed into the lid portion 74 of the holder 63. The spring 82 biases the jacket 31 toward the side opposite to the objective lens 16. In a state where the cooling unit 21 is attached to the stage 3, the jacket 31 is pressed against the holding part 3b by the biasing force. As a result, the elastic members 41, 42 are elastically deformed to come into close contact with the holding part 3b, and the gap between the jacket 31 and the holding part 3b is sealed.

The mechanism portion 16a of the objective lens 16 includes an biasing mechanism 16b for biasing the holder 63 toward the semiconductor device 2 (FIG. 2). The biasing mechanism 16b is used to ensure the close contact of the solid immersion lens 62 to the semiconductor device 2. The biasing mechanism 16b includes, for example, a guide member extending in the axial direction and a spring held by the guide member.

[Space Formed by Cooling Unit]

At the time of inspection of the semiconductor device 2, for example, the solid immersion lens 62 is moved closer to the semiconductor device 2 by moving the objective lens 16 by the X-Y-Z stage from a state in which the solid immersion lens 62 is separated from the semiconductor device 2 as shown in FIG. 8, and the solid immersion lens 62 is brought into contact with the semiconductor device 2 as shown in FIG. 7. In the state shown in FIG. 7, the biasing mechanism 16b ensures (adjusts) the close contact of the solid immersion lens 62 to the semiconductor device 2. In either state of FIGS. 7 and 8, the cooling unit 21 is attached to the stage 3, and a space S1 is formed between the cooling unit 21 and the semiconductor device 2. That is, since the jacket 31 is biased toward the holding part 3b by the coupling portion 81, the cooling unit 21 is maintained in close contact with the stage 3 even in a state where the solid immersion lens 62 is separated from the semiconductor device 2 as shown in FIG. 8.

The space S1 is formed between the package 2b and the die 2c of the semiconductor device 2 and the bottom surface 34a of the first portion 34 of the recessed portion 33 provided in the jacket 31. That is, in this example, the bottom surface 34a of the first portion 34 is a space defining surface that faces the semiconductor device 2 and defines the space S1 between the semiconductor device 2 and the bottom surface 34a. The depth of the space S1 between the package 2b and the bottom surface 34a is deeper than the depth of the space S1 between the die 2c and the bottom surface 34a. The space S1 is continuous with the opening 32 when viewed from the direction D1, and extends in an annular shape so as to surround the opening 32. The width of the space S1 (the minimum width in the direction D1, that is, the distance between the die 2c and the bottom surface 34a in the direction D1) is not less than 0.05 mm and not more than 0.5 mm. In this example, the thickness of the space S1 is equal to the sum of the depth of the first portion 34 and the thickness of the locking portion 3d of the holding part 3b. The above-described groove portion 36 is disposed such that at least a portion thereof is exposed to the space S1.

In a state where the solid immersion lens 62 is in contact with the semiconductor device 2, a space S2 is formed between the bottom surface 34a of the first portion 34 and the holding part 3b and between the bottom surface 35a of the second portion 35 and the holding part 3b. The depth of the space S2 in the second portion 35 is deeper than the depth of the space S2 in the first portion 34. The space S2 is connected to the discharge flow path 52 at the bottom surface 35a. The fluid 5 discharged from the space S1 to the discharge flow path 52 is stored in the space S2 in the second portion 35. That is, the space S2 in the second portion 35 functions as a pool portion that stores the fluid 5 discharged to the discharge flow path 52. The space S2 is connected to the space S1 and extends in an annular shape so as to surround the space S1 when viewed from the direction D1. The outer edge of the space S2 is sealed by the elastic members 41, 42.

The space S3 in the opening 32 is connected to the supply flow path 51. The solid immersion lens unit 61 is disposed in the space S3, and an end portion of the space S3 on the objective lens 16 side is sealed by the above-described sealing member 64. To be more specific, the gap between the jacket 31 and the holding part 3b is sealed by the elastic members 41, 42, so that the end portion of the space S3 on the objective lens 16 side is sealed. Further, as described above, the space between the solid immersion lens 62 and the flexible member 72 and the space between the flexible member 72 and the lid portion 74 of the holder 63 are sealed in a watertight manner. Thus, the space (flow path) constituted by the space S1, S2, and S3 is sealed.

The fluid 5 supplied from the supply flow path 51 to the space S3 flows in the space S1 to S3. The fluid 5 flows from the space S3 to the space S2 via the space S1, and is discharged from the discharge flow path 52. In FIGS. 3 7, and 8, a region in which the fluid 5 flows is indicated by hatching. In this example, when viewed from the direction D1, the position where the fluid 5 is supplied from the supply flow path 51 to the space S1 to S3 is located inside the position where the fluid 5 is discharged from the space S1 to S3 to the discharge flow path 52 (the position of the discharge port 52a). The pressure of the fluid 5 flowing through the space S1 to S3 is changed by the regulator 23. The controller 15 controls the regulators 23 such that the pressure of the fluid 5 flowing through the space S1 to S3 is lower than the pressure outside the cooling unit 21 (that is, the pressure in the space S1 to S3 is negative). As a result, the cooling unit 21 can be suitably brought into close contact with the stage 3.

[Semiconductor Inspection Method]

In the semiconductor inspection method using the semiconductor inspection device 1, first, the semiconductor device 2 are disposed (fixed) on the stage 3 (first step). Subsequently, the cooling unit 21 is disposed such that the opening 32 faces the semiconductor device 2 and the space S1 is defined between the jacket 31 and the semiconductor device 2 (second step). To be more specific, for example, the objective lens 16 (objective lens module 60) is moved by the above-described X-Y-Z stage, and the cooling unit 21 is attached to the stage 3 so that the opening 32 faces the semiconductor device 2. Thus, the space S1 to S3 is formed between the cooling unit 21 and the stage 3.

Subsequently, the objective lens 16 is moved by the X-Y-Z stage to move the solid immersion lens 62 toward the semiconductor device 2, and the abutting surface 62a of the solid immersion lens 62 is brought into contact with the semiconductor device 2 (FIG. 7, third step). Subsequently, the semiconductor device 2 is driven by the signal input device 11 (fourth step). Subsequently, while flowing the fluid 5 through the space S1 to S3, the light coining from the semiconductor device 2 being driven and passing through the opening 32 is detected by the photodetector 14 (fifth step). Through the above steps, the semiconductor device 2 can be inspected as described above. The fourth step of driving the semiconductor device 2 may be performed before the second step or the third step.

When changing the observation area, the objective lens 16 is moved by the X-Y-Z stage to move the solid immersion lens 62 away from the semiconductor device 2 (FIG. 8). At this time, since the jacket 31 is biased toward the holding part 3b by the coupling portion 81, the state in which the cooling unit 21 is in close contact with the stage 3 is maintained. The jacket 31 is also biased toward the holding part 3b by the attractive force of the magnet 38. Subsequently, the objective lens 16 (objective lens module 60) is moved in the X-axis direction and/or the Y-axis direction by the X-Y-Z stage, and the solid immersion lens 62 is moved to a position corresponding to a desired observation area. Subsequently, the objective lens 16 is moved by the X-Y-Z stage to move the solid immersion lens 62 toward the semiconductor device 2, thereby bringing the solid immersion lens 62 into contact with the semiconductor device 2. Thus, the observation area can be changed.

[Function and Effect]

As described above, when the cooling unit 21 is used to inspect the semiconductor device 2, for example, the cooling unit 21 is disposed such that the opening 32 faces the semiconductor device 2 and the space S1 is defined between the bottom surface 34a of the first portion 34 and the semiconductor device 2. Then, while flowing the fluid 5 into the space S1 via the supply flow path 51, the light emitted from the semiconductor device 2 being driven and passing through the openings 32 is detected. Flowing the fluid 5 through the space S1 defined between the jacket 31 and the semiconductor device 2 can effectively cool the semiconductor device 2. This is because the heat of the semiconductor device 2 is removed by the fluid 5 and the heat of the semiconductor device 2 is efficiently transferred to the jacket 31 via the fluid 5. Further, since cooling is performed using the fluid 5, even if the semiconductor device 2 is warped due to a manufacturing error or heat generation, the fluid 5 is in good contact with the semiconductor device 2. Therefore, even in such a case, the cooling performance can be ensured. Therefore, according to the cooling unit 21, high cooling performance can be realized.

The reason why the semiconductor device 2 can be effectively cooled by flowing the fluid 5 through the space S1 will be further described. When a fluid flows on the surface of an object, a boundary layer in which the flow velocity continuously changes is generated at the boundary between the viscous fluid and the object. Typically, the thicker the boundary layer and the less the change in flow velocity with distance from the object, the slower the rate of heat exchange between the fluid and the object. In order to thin the boundary layer, the flow velocity is increased in general. However, in the case of flowing a fluid through a minute gap, if the flow rate is constant, the flow velocity increases as the gap is narrower. Further, the velocity gradient inside the boundary layer is inversely proportional to the size of the gap and increases in proportion to the flow velocity. Therefore, the thermal resistance between the object and the fluid can be significantly suppressed. In the cooling unit 21, by utilizing this phenomenon, thermal resistance in heat transfer from the semiconductor device 2 to the fluid 5 and heat transfer from the fluid 5 to the jacket 31 can be significantly suppressed, and heat of the semiconductor device 2 can be efficiently transferred.

As another cooling method, a method of cooling the semiconductor device 2 by bringing a cooling block into close contact with the semiconductor device 2 via thermal conductive grease is considered. However, in such a semiconductor inspection device 1, since there is a possibility that close contact of the solid immersion lens 62 to the semiconductor device 2 is hindered by the thermal conductive grease, the thermal conductive grease cannot be used. In contrast, in the cooling unit 21, the fluid 5 can function as dynamic grease by providing a small gap (space S1) between the jacket 31 and the semiconductor device 2 and causing the fluid 5 to flow through the gap. As a result, the semiconductor device 2 can be effectively cooled.

The jacket 31 is provided with a discharge flow path 52 through which the fluid 5 discharged from the space S1 flows. This allows the fluid to flow into the space S1 via the supply flow path 51 and the discharge flow path 52, thereby the semiconductor device 2 can be more effectively cooled.

The jacket 31 is provided with the coolant flow path 55 through which a coolant 6 for cooling the jacket 31 flows. Thus, the jacket 31 can be more suitably cooled.

The bottom surface 34a of the first portion 34 is continuous with the opening 32 and extends in a planar shape so as to surround the opening 32. Thus, the semiconductor device 2 can be cooled more effectively.

The thickness of the space S1 is not less than 0.05 mm and not more than 0.5 mm Thus, the semiconductor device 2 can be cooled more effectively. That is, when the thickness of the space S1 is not less than 0.05 mm and not more than 0.5 mm, the heat of the semiconductor device 2 can be effectively removed by the fluid 5. As a result, for example, the semiconductor device 2 of about 200 W can be cooled at a flow rate of about 0.2 liters/minute. The thickness of the space S1 may be more than 0 mm and not more than 0.05 mm. In this case, the fluid 5 flowing through the space S1 easily functions as a heat conductive medium, and the heat of the semiconductor device 2 can be more efficiently transferred to the jacket 31. The space S1 may be not less than 0.1 mm and not more than 0.5 mm.

The space defining surface that defines the space S1 is the bottom surface 34a of the recessed portion 33 formed in the jacket 31. Accordingly, the space S1 can be more suitably defined between the jacket 31 and the semiconductor device 2.

The cooling unit 21 includes the elastic members 41, 42 sandwiched between the jacket 31 and the stage 3 to seal the space S1. Thus, the space S1 between the jacket 31 and the semiconductor device 2 can be more reliably sealed.

The jacket 31 is provided with four supply flow paths 51. Thus, the semiconductor device 2 can be cooled more effectively. That is, by providing at least two supply flow paths 51, regardless of the contact position of the solid immersion lens 62 with respect to the semiconductor device 2, the fluid 5 can be supplied to the periphery of the contact position. Further, since at least two supply flow paths 51 are provided, the pressure of the fluid 5 flowing through the space S1 can be easily controlled. When at least three supply flow paths 51 are provided, these functions and effects are remarkably exhibited.

When viewed from the direction D1, the position at which the fluid 5 is supplied from the supply flow path 51 to the space S1 is located inside the position at which the fluid 5 is discharged from the space S1 to the discharge flow path 52. Thus, the semiconductor device 2 can be cooled more effectively. The supply flow path 51 is configured to discharge the fluid 5 toward the opening 32. Thus, the semiconductor device 2 can be cooled more effectively.

The groove portion 36 is formed in the bottom surface 34a. Accordingly, the fluid 5 flowing through the space S1 can be made turbulent, and the heat of the semiconductor device 2 can be more efficiently transferred to the jacket 31. This is because the boundary layers can be made thinner and the temperature of the fluid 5 flowing through the space S1 can be made uniform by the turbulent flow.

The objective lens module 60 includes the spring 82 that biases the cooling unit 21 toward the side opposite to the objective lens 16. Accordingly, the cooling unit 21 can be more suitably brought into close contact with the stage 3.

The holder 63 has the flexible member 72 which is in contact with the peripheral portion of the solid immersion lens 62 and holds the solid immersion lens 62 in a watertight and swingable manner. Accordingly, since the solid immersion lens 62 is swingable, the solid immersion lens 62 is easily brought into close contact with the semiconductor device 2. Further, since the solid immersion lens 62 is held watertight, the fluid 5 can be prevented from leaking from the periphery of the solid immersion lens 62.

The objective lens module 60 includes the sealing member 64 that is sandwiched between the holder 63 and the jacket 31 to seal between the holder 63 and the jacket 31. This can prevent the fluid 5 from leaking from between the holder 63 and the jacket 31.

The semiconductor inspection device 1 includes the regulator 23 that changes the pressure of the fluid 5 flowing through the space S1, and the controller 15 that controls the regulator 23. Thus, the semiconductor device 2 can be cooled more effectively.

In the semiconductor inspection device 1, the controller 15 controls the regulators 23 such that the pressure of the fluid 5 flowing through the space S1 is lower than the pressure outside the cooling unit 21. As a result, the pressure in the space S1 becomes negative, so that the cooling unit 21 can be more suitably brought into close contact with the stage 3. In addition, it is possible to suppress leakage of the fluid 5 from the gap or the like in the space S1 to S3.

[Modification]

Figure 9:
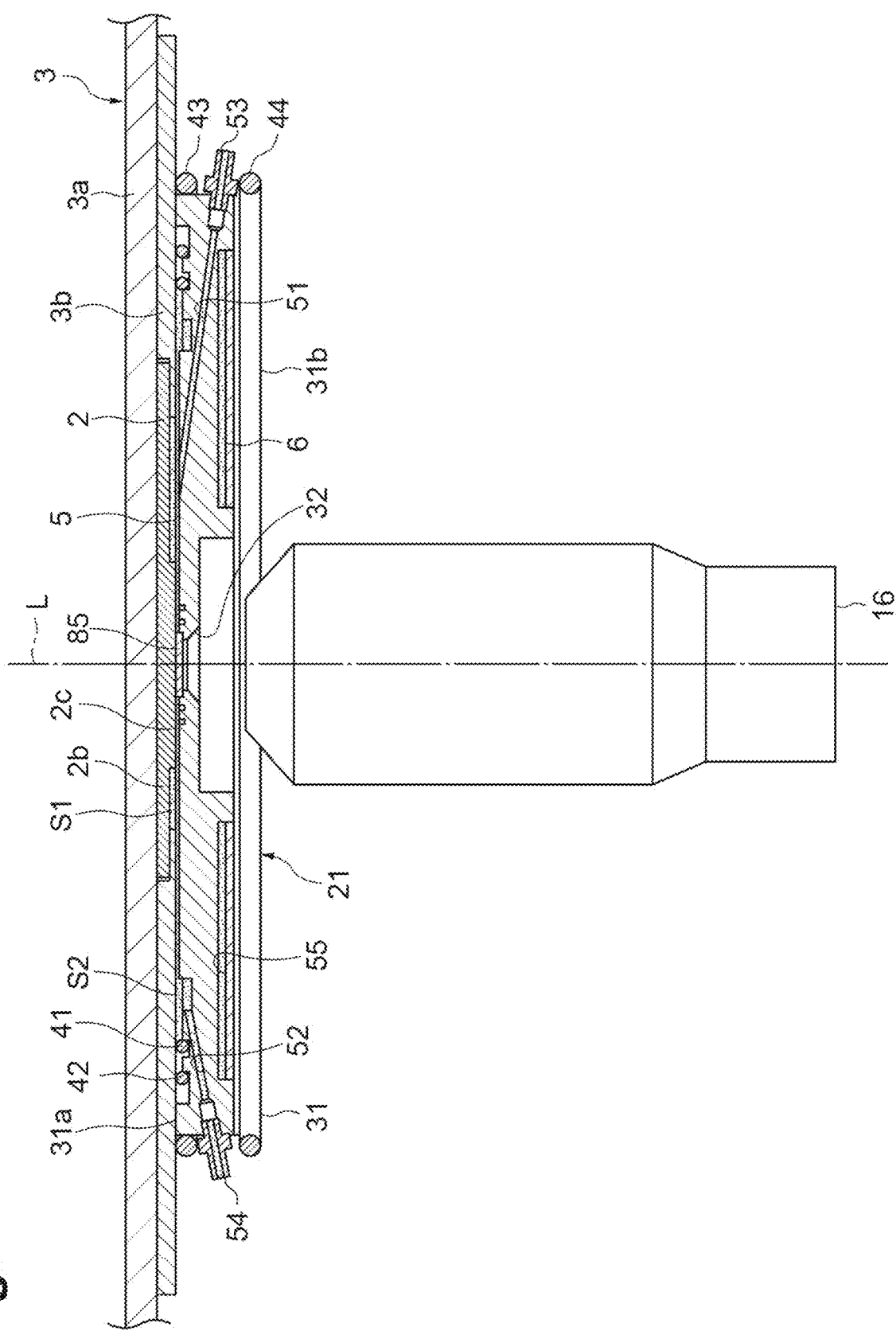
FIG. 9 is a cross-sectional view of a cooling unit of a modification.
Figure 10:
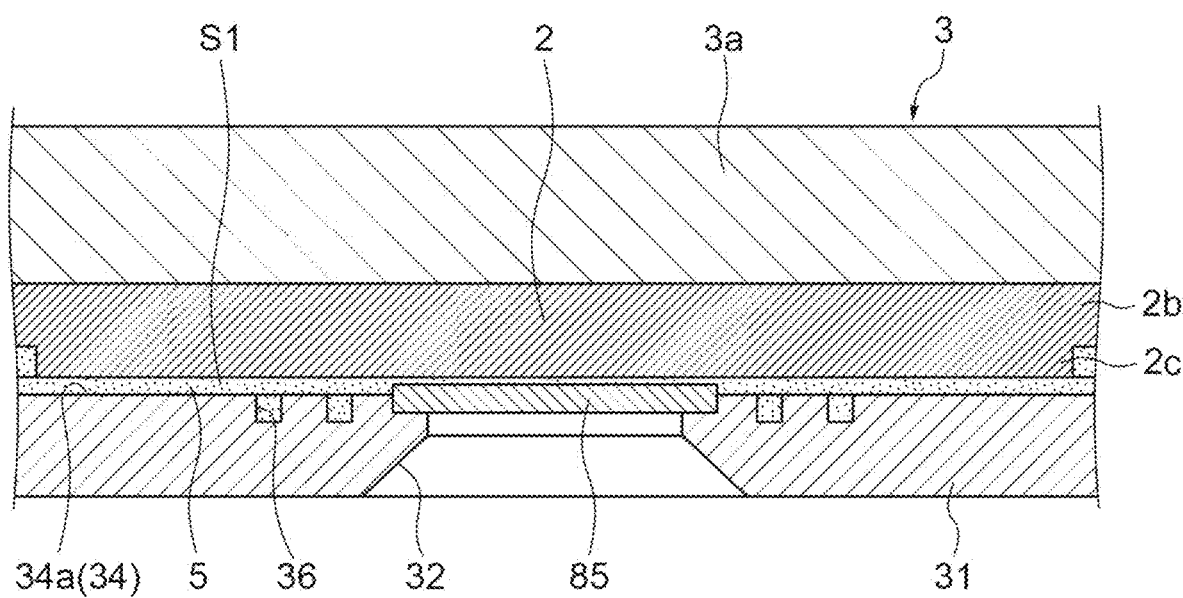
FIG. 10 is a partially enlarged view of FIG. 9.
Figure 11:
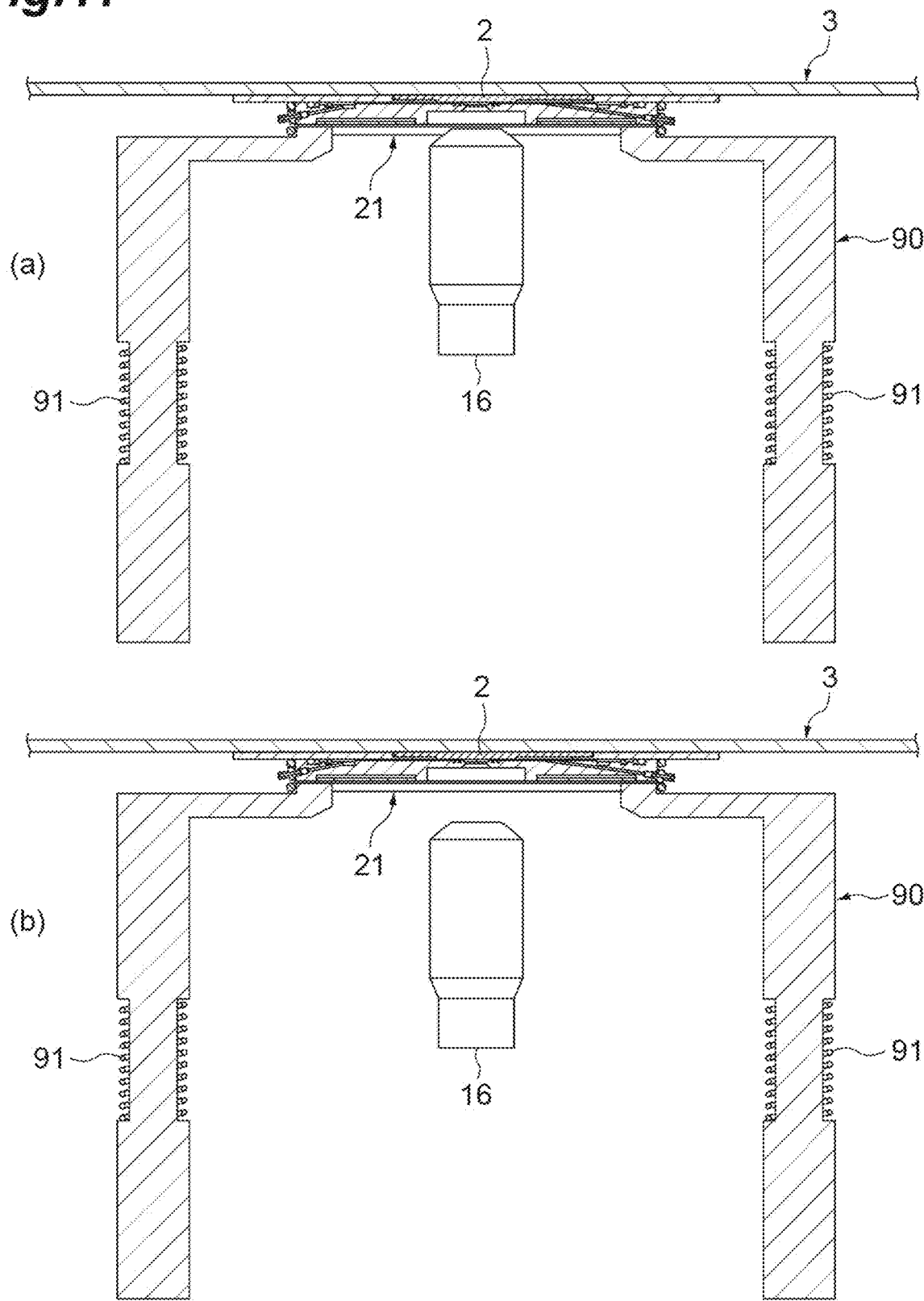
FIG. 11(a) is a cross-sectional view showing the objective lens at the inspection position.
FIG. 11(b) is a cross-sectional view showing the objective lens at the lens switching position.

The cooling unit 21 may be configured as in the modifications shown in FIGS. 9 10, and 11. In the modification, the cooling unit 21 is configured separately from the objective lens 16. The solid immersion lens unit 61 is not attached to the objective lens 16. A light transmitting member 85 is disposed in the opening 32 of the jacket 31. The light transmitting member 85 is formed of glass in a plate shape, for example, and transmits observation light. The light transmitting member 85 watertightly closes the opening 32. For example, the light transmitting member 85 is disposed so as to protrude from the opening 32 toward the semiconductor device 2 side, and faces the die 2c of the semiconductor device 2 with a predetermined gap therebetween. In the modification, a space S1 is formed between the package 2b and the die 2c of the semiconductor device 2 and the bottom surface 34a of the first portion 34 of the recessed portion 33 provided in the jacket 31. Similarly to the above embodiment, the space S2 is formed between the bottom surface 34a of the first portion 34 and the holding part 3b and between the bottom surface 35a of the second portion 35 and the holding part 3b. In the modification, since the opening 32 is closed by the light transmitting member 87, the space S1 is not connected to the space in the opening 32.

According to this modification, the semiconductor device 2 can be inspected and observed in a similar manner as in the above embodiment. In addition, for the reasons described above, high cooling performance can be realized. Further, since the light transmitting member 85 closes the opening 32 in a watertight manner, the fluid 5 can be prevented from leaking from the opening 32.

As shown in FIG. 11, the semiconductor inspection device 1 according to the modification includes a biasing device 90 that biases the cooling unit 21 toward the stage 3. The biasing device 90 has, for example, a spring 91 and is fixed to the X-Y-Z stage, and biases the cooling unit 21 at its peripheral portion by the spring 91. Accordingly, the cooling unit 21 can be more suitably brought into close contact with the stage 3.

When the semiconductor device 2 is inspected, the objective lens 16 is positioned at the inspection position shown in FIG. 11(a). When the observation area is changed and the lens of the objective lens 16 is switched, the objective lens 16 is lowered from the inspection position to the lens switching position shown in IG 11(b). Then, after being moved in the X and Y directions to a position corresponding to a desired observation area, it is raised to the inspection position. When the observation area is changed and the lens of the objective lens 16 is not switched, the objective lens 16 is moved in the X and Y directions to a position corresponding to a desired observation area while being positioned at the inspection position.

The material and shape of each component are not limited to those described above, and various materials and shapes can be adopted. In the above embodiment, the semiconductor inspection device 1 is configured as a device for observing the semiconductor device 2 from the vertically lower side, but may be configured as a device for observing the semiconductor device 2 from the vertically upper side. In this case, the semiconductor device 2 may be placed on the stage 3.

In the above embodiment, the space defining surface that defines the space S1 between the semiconductor device 2 is constituted by the bottom surface 33a that is a bottom surface of the recessed portion 33, but the configuration of the space defining surface is not limited thereto. For example, the recessed portion 33 may not be formed in the first face 31a of the jacket 31, and the space defining face may be constituted by the first face 31a formed to be flat. The space defining surface may be provided with a protruding portion that abuts the semiconductor device 2 to define the spacing between the space defining surface and the semiconductor device 2. In this case, the height of the protruding portion is the space S1. In the case where the light transmitting member 85 is provided as in the modification, the protruding portion may be provided to the light transmitting member 85.

In the above embodiment, the groove portion 36 extending in a spiral shape is formed on the bottom surface 34a of the first portion 34, but at least one of a recessed portion and a protruding portion may be formed on the bottom surface 34a. For example, a plurality of annular groove portions arranged in the radial direction may be formed in the bottom surface 34a. That is, concentric grooves may be formed on the bottom surface 34a. Alternatively, a plurality of protruding portions may be formed on the bottom surface 34a to make the fluid 5 flowing through the space S1 turbulent.

In the above embodiment, the jacket 31 is cooled by the coolant 6 made of water, but may be cooled by the coolant 6 made of air. That is, the jacket 31 may be air-cooled instead of liquid-cooled. In this case, a thermostreamer may be used. The jacket 31 may be provided with a sensor for detecting the temperature of the jacket 31. In this case, the cooling operation can be controlled in accordance with the temperature of the jacket 31. At least one of the discharge flow path 52 and the coolant flow path 55 may not be provided. When the discharge flow path 52 is not provided, the fluid 5 may be discharged from, for example, a gap formed between the stage 3 and the jacket 31. Only one supply flow path 51 may be provided, and/or only one discharge flow path 52 may be provided.

The pressure of the fluid in the storage tank 22 may be increased by raising the position of the storage tank 22 instead of increasing the pressure by the compressor. A flow rate sensor may be provided in at least one of the supply flow path 51 and the discharge flow path 52. The fluid 5 stored in the drain tank 24 may be returned to the storage tank 22 and reused after removing dirt by a filter or the like.

The semiconductor device 2 is not limited to a device including a logic LSI. The semiconductor device 2 may be a discrete semiconductor element, an optoelectronic element, a sensor/actuator, a memory element, a linear integrated circuit (IC), or the like, or a hybrid device thereof. The individual semiconductor elements include diodes, power transistors, and the like. The semiconductor device 2 may be packages, composite substrate, or the like including the semiconductor device. The semiconductor device 2 may be formed by, for example, forming a plurality of elements (capacitors and the like) in a silicon substrate. In the above embodiment, the regulator 23 and the chiller 25 are controlled by the controller 15 that controls the signal input device 11 and the like. However, the controller that controls the regulator 23 and the chiller 25 may be configured separately from the controller that controls the signal input device 11 and the like.

REFERENCE SIGNS LIST

1: semiconductor inspection device, 2: semiconductor device, 3: stage, 5: fluid, 6: coolant, 14: photodetector, 15: controller, 16: objective lens, 21: cooling unit, 23: regulator (pressure adjuster), 31: jacket, 32: opening (light passing portion), 33: recessed portion; 34a: bottom surface (space defining surface), 36: groove (recessed portion), 41, 42: elastic member, 51: supply flow path, 52: discharge flow path, 55: coolant flow path, 60: objective lens module, 62: solid immersion lens, 63: holder, 64: sealing member, 72: flexible member, 82: spring (biasing member), 85: light transmitting member, 90: biasing device, S1: space

The invention claimed is:

1. A cooling unit to be used in an inspection of a semiconductor device, the cooling unit comprising:
a jacket for dissipating heat of the semiconductor device, wherein the jacket is provided with a light passing portion through which light from the semiconductor device passes,
the jacket has a space defining surface that faces the semiconductor device and defines a space between the space defining surface and the semiconductor device in a state where the light passing portion faces the semiconductor device, and
the jacket is provided with a supply flow path through which a fluid to be supplied to the space flows.

2. The cooling unit according to claim 1, wherein the jacket is further provided with a discharge flow path through which the fluid discharged from the space flows.

3. The cooling unit according to claim 1, wherein the jacket is further provided with a coolant flow path through which a coolant for cooling the jacket flows.

4. The cooling unit according to claim 1, wherein the space defining surface extends so as to surround the light passing portion.

5. The cooling unit according to claim 1, wherein the space defining surface extends in a plane shape.

6. The cooling unit according to claim 1, wherein the space defining surface is continuous with the light passing portion.

7. The cooling unit according to claim 1, wherein the space defining surface is a bottom surface of a recess formed in the jacket.

8. The cooling unit according to claim 1, wherein the thickness of the space is not less than 0.05 mm and not more than 0.5 mm.

9. The cooling unit according to claim 1, wherein the thickness of the space is more than 0 mm and not more than 0.05 mm or less.

10. The cooling unit according to claim 1, further comprising an elastic member that is sandwiched between the jacket and a stage on which the semiconductor device is disposed and seals the space.

11. The cooling unit according to claim 1, wherein the jacket is provided with at least two of the supply flow paths.

12. The cooling unit according to claim 2, wherein, when viewed from a direction perpendicular to the space defining surface, a position at which the fluid is supplied from the supply flow path to the space is located inside a position at which the fluid is discharged from the space to the discharge flow path.

13. The cooling unit according to claim 1, wherein the supply flow path is configured to discharge the fluid toward the light passing portion.

14. The cooling unit according to claim 1, wherein at least one of a recessed portion and a protruding portion is formed on the space defining surface.

15. The cooling unit according to claim 1, wherein the light passing portion is configured by disposing a light transmitting member in an opening provided to the jacket.

16. The cooling unit according to claim 15, wherein the light transmitting member closes the opening in a watertight manner.

17. An objective lens module comprising:
the cooling unit according to claim 1;
an objective lens facing the light passing portion; and
a solid immersion lens held so as to be positioned on an optical axis of the objective lens,
wherein the light passing portion is constituted by an opening provided to the jacket, and
the solid immersion lens is disposed in the opening.

18. The objective lens module according to claim 17, further comprising a biasing member that biases the cooling unit toward a side opposite to the objective lens.

19. The objective lens module according to claim 17, further comprising a holder attached to the objective lens and holding the solid immersion lens,
wherein the holder has a flexible member that is in contact with a peripheral portion of the solid immersion lens and holds the solid immersion lens in a watertight and swingable manner.

20. The objective lens module according to claim 17, further comprising:
a holder attached to the objective lens and holding the solid immersion lens; and
a sealing member sandwiched between the holder and the jacket to seal between the holder and the jacket.

21. A semiconductor inspection device comprising:
the cooling unit according to claim 1;
a stage on which the semiconductor device is disposed;
an objective lens facing the semiconductor device via the light passing portion; and
a photodetector that detects light from the semiconductor device via the light passing portion and the objective lens.

22. The semiconductor inspection device according to claim 21, further comprising:
a pressure adjuster that changes a pressure of the fluid flowing through the space; and
a controller that controls the pressure adjuster.

23. The semiconductor inspection device according to claim 22, wherein the controller controls the pressure adjuster such that a pressure of the fluid flowing through the space is lower than a pressure outside the cooling unit.

24. The semiconductor inspection device according to claim 21, further comprising a biasing device that biases the cooling unit toward the stage.

25. A semiconductor inspection method comprising:
- disposing a semiconductor device on a stage;
- disposing a cooling unit having a jacket provided with a light passing portion that passes light from a semiconductor device such that the light passing portion faces the semiconductor device and a space is defined between the jacket and the semiconductor device;
- driving the semiconductor device; and
- detecting, by a photodetector, light coming from the semiconductor device being driven and passing through the light passing portion while flowing a fluid through the space.

\* \* \* \* \*